United States Patent
Kim et al.

(10) Patent No.: US 11,726,406 B2
(45) Date of Patent: Aug. 15, 2023

(54) METHOD OF COATING A PHOTORESIST AND APPARATUS FOR PERFORMING THE SAME

(71) Applicants: Sunghwan Kim, Hanam-si (KR); Ho-Young Kim, Seoul (KR); Seok Heo, Hwaseong-si (KR); Dongwook Kim, Seoul (KR); Sungjin Kim, Suwon-si (KR); Chaehung Lim, Hwaseong-si (KR); Jaekyung Park, Seoul (KR); Jae Hong Lee, Seongnam-si (KR); Junyoung Lee, Yongin-si (KR)

(72) Inventors: Sunghwan Kim, Hanam-si (KR); Ho-Young Kim, Seoul (KR); Seok Heo, Hwaseong-si (KR); Dongwook Kim, Seoul (KR); Sungjin Kim, Suwon-si (KR); Chaehung Lim, Hwaseong-si (KR); Jaekyung Park, Seoul (KR); Jae Hong Lee, Seongnam-si (KR); Junyoung Lee, Yongin-si (KR)

(73) Assignees: Samsung Electronics Co., Ltd., Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 17/718,648

(22) Filed: Apr. 12, 2022

(65) Prior Publication Data
US 2023/0119739 A1    Apr. 20, 2023

(30) Foreign Application Priority Data
Oct. 14, 2021 (KR) .................. 10-2021-0136230

(51) Int. Cl.
*G03F 7/16* (2006.01)
*G03F 7/20* (2006.01)

(52) U.S. Cl.
CPC .............. *G03F 7/162* (2013.01); *G03F 7/168* (2013.01); *G03F 7/2028* (2013.01)

(58) Field of Classification Search
None
See application file for complete search history.

(56) References Cited

U.S. PATENT DOCUMENTS 7,691,559 B2   4/2010   Chang et al.
8,318,607 B2   11/2012  Rathsack et al.
(Continued)

FOREIGN PATENT DOCUMENTS

JP    2004/0089754 A    3/2004
KR    100801159 B1      2/2008
(Continued)

*Primary Examiner* — James M Mellott
(74) *Attorney, Agent, or Firm* — Harness, Dickey & Pierce, P.L.C.

(57) ABSTRACT

In a method of coating a photoresist, the photoresist may be provided to an upper surface of a rotating wafer. A hovering solution may be injected to an edge portion of the photoresist under a condition that the hovering solution may be hovered with respect to the edge portion of the photoresist with an air layer being interposed between the hovering solution and the edge portion of the photoresist to limit and/or prevent a bead of the photoresist from being formed on an edge portion of the upper surface of the wafer. Thus, the photoresist having a uniform thickness may be coated on the upper surface of the wafer to improve a yield of a semiconductor device by increasing an effective area of the edge portion of the wafer.

14 Claims, 8 Drawing Sheets

(56) References Cited

U.S. PATENT DOCUMENTS

| | | |
|---|---|---|
| 9,508,558 B2 | 11/2016 | Lin |
| 2007/0054050 A1 | 3/2007 | Lee et al. |
| 2014/0130981 A1 | 5/2014 | Benson |

FOREIGN PATENT DOCUMENTS

| | | |
|---|---|---|
| KR | 100934837 B1 | 12/2009 |
| KR | 2010/0078033 A | 7/2010 |
| KR | 101654515 B1 | 9/2016 |

METHOD OF COATING A PHOTORESIST AND APPARATUS FOR PERFORMING THE SAME

CROSS-RELATED APPLICATION

This application claims priority under 35 USC § 119 to Korean Patent Application No. 10-2021-0136230, filed on Oct. 14, 2021 in the Korean Intellectual Property Office (KIPO), the contents of which are herein incorporated by reference in their entirety.

BACKGROUND

1. Field

Example embodiments relate to a method of coating a photoresist and/or an apparatus for performing the same. More particularly, example embodiments relate to a method of coating a photoresist solution on an upper surface of a wafer and/or an apparatus for performing the method.

2. Description of the Related Art

Generally, a photoresist solution may be dispensed on an upper surface of a rotating wafer. Thus, the photoresist solution may move to an edge portion of the wafer by a centrifugal force generated from the rotating wafer. A bead having a thickness thicker than a thickness of the photoresist solution on a central portion of the wafer may be formed on the edge portion of the wafer due to the movement of the photoresist solution to the edge portion of the wafer. The bead may cause an error in a subsequent exposure process. Thus, a process for removing the bead may be performed before the exposure process.

According to related arts, after forming the bead on the edge portion of the wafer, the bead may then be removed. That is, the process for removing the bead may be performed after a thickness profile of the photoresist on the wafer may be set. An area of the bead, e.g., an area of the edge portion of the wafer to be removed may be determined by physical characteristics such as a surface tension of the photoresist. As a result, a great amount of area in the edge portion of the wafer may be removed to reduce a yield of a semiconductor device from the wafer.

SUMMARY

Example embodiments provide a method of coating a photoresist that may be capable of limiting and/or preventing a bead from being formed on an edge portion of a wafer.

Example embodiments also provide an apparatus for performing using the above-mentioned method.

According to example embodiments, a method of coating a photoresist may include providing the photoresist on an upper surface of a wafer, the wafer being rotated, and injecting a hovering solution toward an edge portion of the photoresist. The hovering solution may be injected toward the edge portion of the photoresist under a hovering condition such that the hovering solution hovers with respect to the edge portion of the photoresist on an edge portion of the upper surface of the wafer with an air layer between the hovering solution and the photoresist to limit prevent a bead of the photoresist from forming on the edge portion of the upper surface of the wafer.

According to example embodiments, a method of coating a photoresist may include dispensing a solvent on an upper surface of a wafer; dispensing the photoresist on the upper surface of the wafer; rotating the wafer to planarize the photoresist while simultaneously injecting a hovering solution toward an edge portion of the photoresist; and reflowing the photoresist. The hovering solution may be injected in a direction substantially perpendicular to the upper surface of the wafer under a hovering condition such that the hovering solution hovers with respect to the edge portion of the photoresist on an edge portion of the upper surface of the wafer with an air layer between the hovering solution and the photoresist to limit and/or prevent a bead of the photoresist from forming on the edge portion of the upper surface of the wafer.

According to example embodiments, an apparatus for coating a photoresist may include a spin chuck configured to rotate a wafer; a photoresist nozzle over a central portion of the spin chuck and configured to provide the photoresist to an upper surface of the wafer; a hovering solution nozzle on an edge portion of the spin chuck and configured to inject a hovering solution toward an edge portion of the photoresist on an edge portion of an upper surface of the wafer; and a controller. The controller may be configured to control the injection of the hovering solution with a hovering condition such that the hovering solution hovers with respect to the edge portion of the photoresist on the edge portion of the upper surface of the wafer with an air layer between the hovering solution and the photoresist.

According to example embodiments, during planarizing the photoresist on the upper surface of the wafer, the hovering solution may be injected toward the edge portion of the photoresist under the condition that the hovering solution may be hovered with respect to the edge portion of the photoresist on the edge portion of the wafer to apply a pressure to the edge portion of the photoresist without a direct contact between the hovering solution and the edge portion of the photoresist. Thus, a bead of the photoresist may not be formed on the edge portion of the wafer. As a result, the photoresist having a uniform thickness may be coated on the upper surface of the wafer to improve a yield of a semiconductor device by increasing an effective area of the edge portion of the wafer.

BRIEF DESCRIPTION OF THE DRAWINGS

Example embodiments will be more clearly understood from the following detailed description taken in conjunction with the accompanying drawings.

FIG. 1 is a view illustrating an apparatus for coating a photoresist in accordance with example embodiments;

FIGS. 2 to 8 are cross-sectional views illustrating a method of coating a photoresist on an upper surface of a wafer using the apparatus in FIG. 1;

FIG. 9 is a view illustrating a hovering operation of a hovering solution injected from a hovering solution in FIG. 6 with respect to a photoresist on an edge portion of a wafer;

FIG. 10 is a graph showing a thickness of an air layer between a hovering solution and a photoresist;

FIG. 11 is a graph showing a pressure differentiation of an air layer along a horizontal lengthwise direction;

FIG. 12 is a graph showing a pressure of an air layer along a horizontal lengthwise direction;

FIG. 13 is a graph showing a hovered region of a hovering solution; and

FIG. 14 is a view illustrating Marangoni effect between a hovering solution and a photoresist.

DETAILED DESCRIPTION

Hereinafter, example embodiments will be explained in detail with reference to the accompanying drawings.

Figure 1:
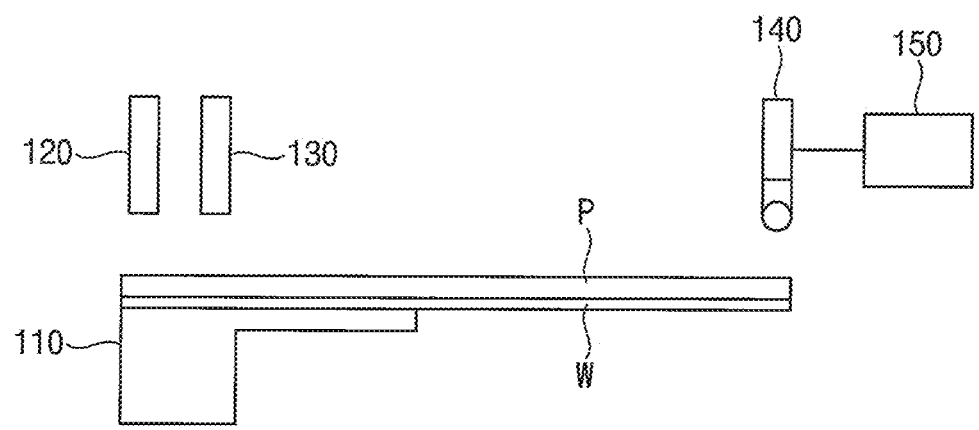
FIGS. 1 to 14 represent non-limiting, example embodiments as described herein.

FIG. 1 is a view illustrating an apparatus for coating a photoresist in accordance with example embodiments.

Referring to FIG. 1, an apparatus for coating a photoresist in accordance with example embodiments may include a spin chuck 110, a solvent nozzle 120, a photoresist nozzle 130, a hovering solution nozzle 140, a controller 150 and a reflower 160.

Figure 3:
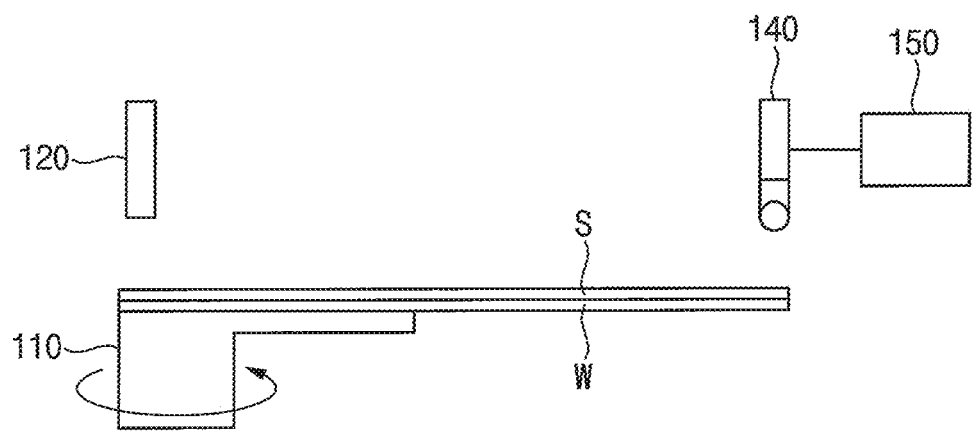

A wafer W may be placed on an upper surface of the spin chuck 110. The spin chuck 110 may be configured to rotate the wafer W centering around a vertical direction. In an embodiment, the spin chuck 110 may include a chuck for holding the wafer W and an electric motor for rotating the wafer W about a vertical axis through a portion the spin chuck 110, as shown in FIG. 3. The spin chuck 110 may hold the wafer W using various means, such as vacuum conduits to vacuum chuck the wafer W, electrodes for electrostatically chucking the wafer W, and/or a clamp to hold the wafer W.

The solvent nozzle 120 may be arranged over a central portion of the spin chuck 110. Particularly, the solvent nozzle 120 may be arranged in the vertical direction substantially perpendicular to the upper surface of the spin chuck 110. The solvent nozzle 120 may dispense a solvent to a central portion of an upper surface of the wafer W on the spin chuck 110 along the vertical direction. A pump may be used to dispense the solvent using the solvent nozzle 120. After the solvent nozzle 120 may dispense the solvent the central portion of the upper surface of the wafer W, the spin chuck 110 may rotate the wafer W. Thus, the solvent on the central portion of the upper surface of the wafer W may spread to an edge portion of the upper surface of the wafer W by a centrifugal force generated by the rotated wafer W.

The photoresist nozzle 130 may be arranged over the central portion of the spin chuck 110. The photoresist nozzle 130 may be arranged in the vertical direction. The photoresist nozzle 130 may dispense a photoresist P to the central portion of the upper surface of the wafer W on the spin chuck 110 along the vertical direction. A pump may be used to dispense the photoresist P using the photoresist nozzle 130. FIG. 1 may show the photoresist nozzle 130 positioned by the solvent nozzle 120. Actually, after the solvent nozzle 120 may dispense the solvent, the photoresist nozzle 130 may be located at a position where the solvent nozzle 120 may be previously located. After the photoresist nozzle 130 may dispense the photoresist P the central portion of the upper surface of the wafer W, the spin chuck 110 may rotate the wafer W. Thus, the photoresist P on the central portion of the upper surface of the wafer W may spread to the edge portion of the upper surface of the wafer W by a centrifugal force generated by the rotated wafer W. However, the photoresist P may be cohered with each other, such as aggregate and/or accumulate, on the edge portion of the upper surface of the wafer W to form a bead.

The hovering solution nozzle 140 may be arranged over the edge portion of the wafer W. The hovering solution nozzle 140 may be arranged in the vertical direction. The hovering solution nozzle 140 may inject a hovering solution to an edge portion of the photoresist P on the edge portion of the upper surface of the wafer W to limit and/or prevent the edge bead of the photoresist P from generating on the edge portion of the upper surface of the wafer W. In example embodiments, the hovering solution may include a material having a surface tension lower than a surface tension of the photoresist P. For example, the hovering solution may include water, not limited thereto. A pump may be used to dispense the hovering solution using the hovering solution nozzle 140.

Particularly, during the wafer W with the photoresist P may be rotated by the spin chuck 110, the hovering solution nozzle 140 may inject the hovering solution to the edge portion of the wafer W. That is, the injection of the hovering solution may be performed simultaneously with the planarization process of the photoresist P to limit and/or prevent the edge bead of the photoresist P from being generated on the edge portion of the wafer W.

Here, a hovering phenomenon may mean that the hovering solution injected to the photoresist P may not directly make contact with the photoresist P, because of an air layer over the rotated wafer W, so that the hovering solution may be positioned spaced apart from the photoresist P by a gap. That is, the air layer may be interposed between the hovering solution and the photoresist P to limit and/or prevent the direct contact between the hovering solution and the photoresist P. Thus, the hovering solution injected from the hovering solution nozzle 140 may provide the edge portion of the photoresist P on the edge portion of the wafer W with a pressure through the air layer. The air layer may refer to an air space or air region between the edge portion of the photoresist P and hovering solution.

The hovering condition of the hovering solution may include an upward repulsive force vertically generated from the air layer to the hovering solution may be stronger than a downward repulsive force vertically applied from the hovering solution to the air layer.

The hovering condition may be set by the controller 150. The controller 150 may control a size, the pressure, etc., of the hovering solution in accordance with the set hovering condition.

The reflower 160 may be configured to reflow the photoresist P on the upper surface of the wafer W using an infrared ray. The reflower 160 may include a lamp or other energy source that radiates infrared rays toward the photoresist P to heat the photoresist P for a reflow process, but example embodiments are not limited thereto.

Figure 9:
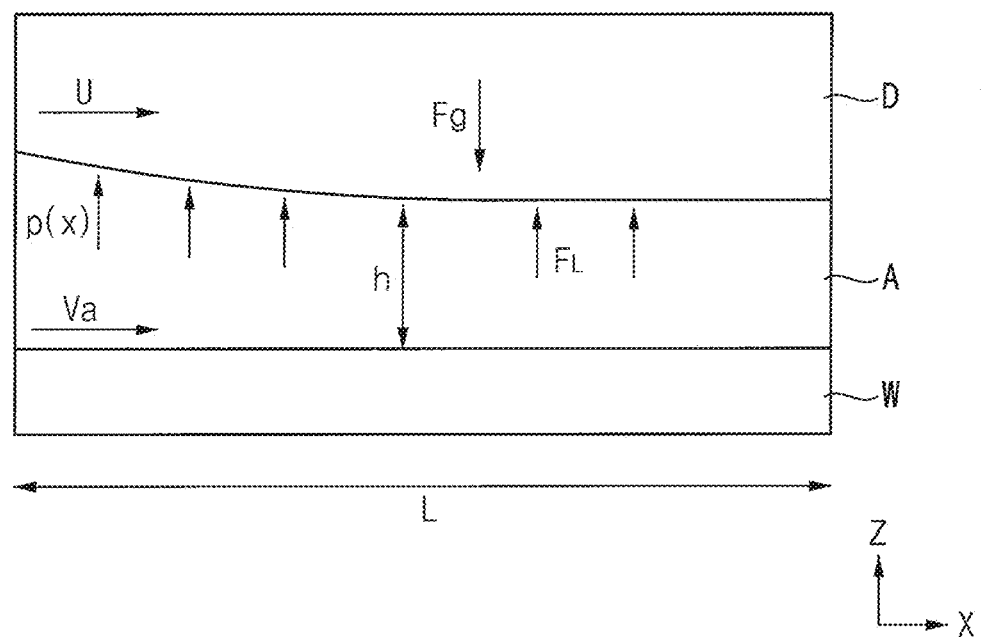
Figure 10:
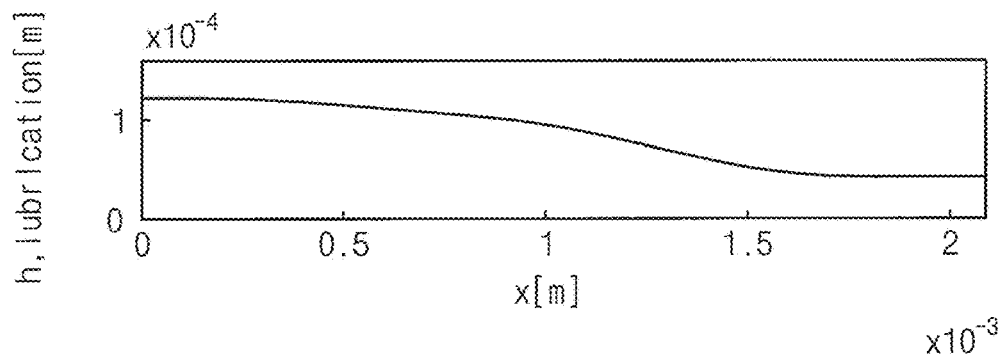
Figure 11:
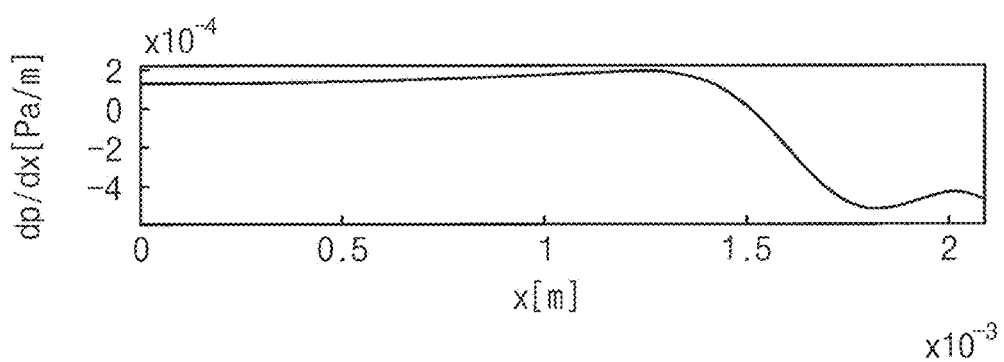
Figure 12:
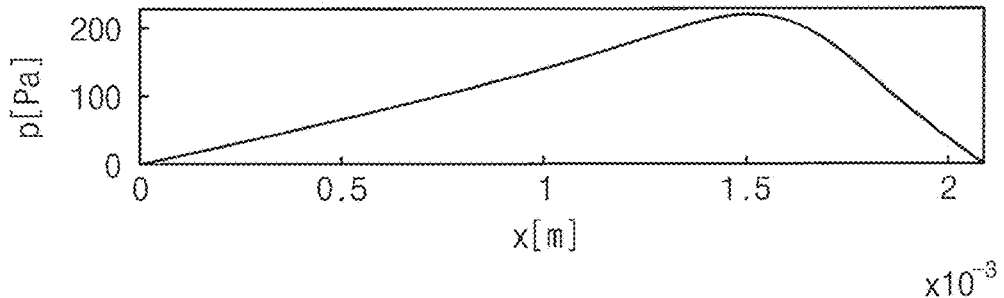
Figure 13:
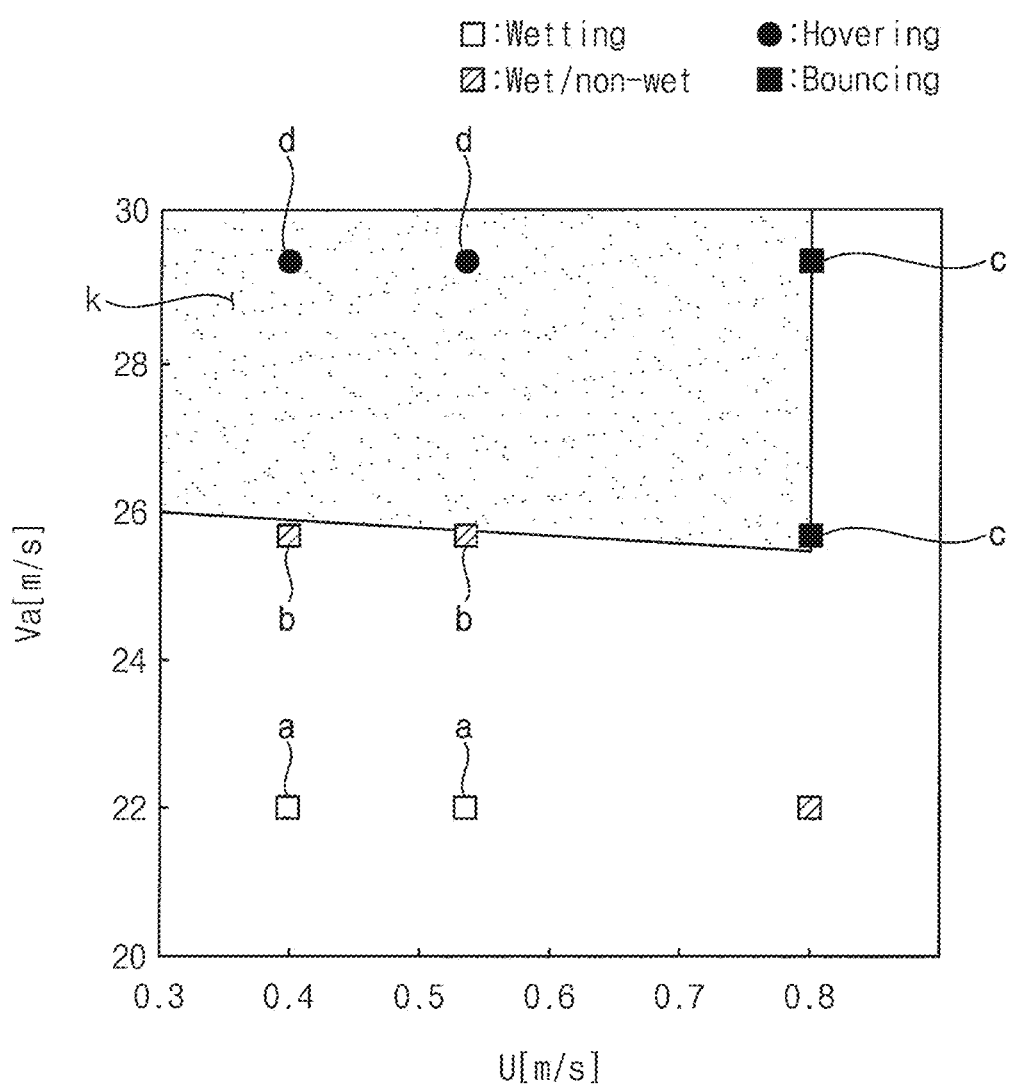
Figure 14:
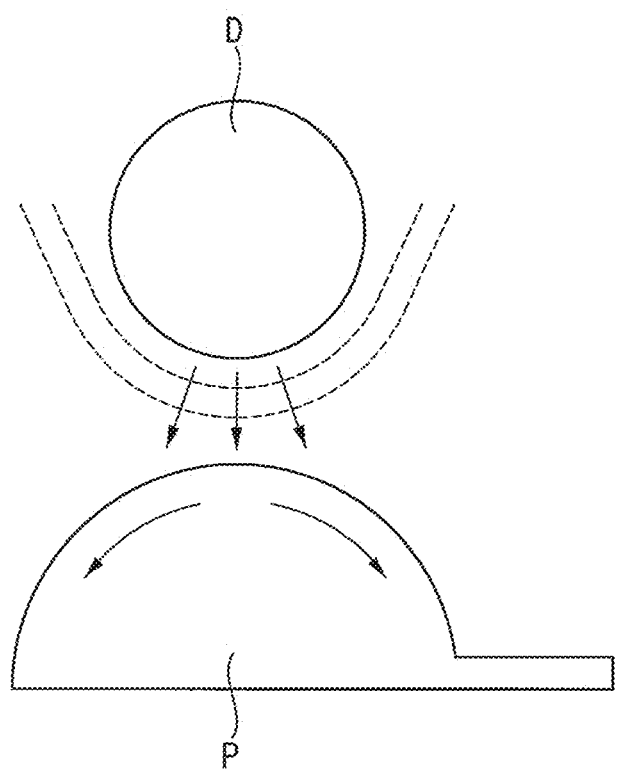

FIGS. 2 to 8 are cross-sectional views illustrating a method of coating a photoresist on an upper surface of a wafer using the apparatus in FIG. 1. FIG. 9 is a view illustrating a hovering operation of a hovering solution injected from a hovering solution in FIG. 6 with respect to a photoresist on an edge portion of a wafer. FIG. 10 is a graph showing a thickness of an air layer between a hovering solution and a photoresist. FIG. 11 is a graph showing a pressure differentiation of an air layer along a horizontal lengthwise direction. FIG. 12 is a graph showing a pressure of an air layer along a horizontal lengthwise direction. FIG. 13 is a graph showing a hovered region of a hovering solution and FIG. 14 is a view illustrating Marangoni effect between a hovering solution and a photoresist.

Figure 2:
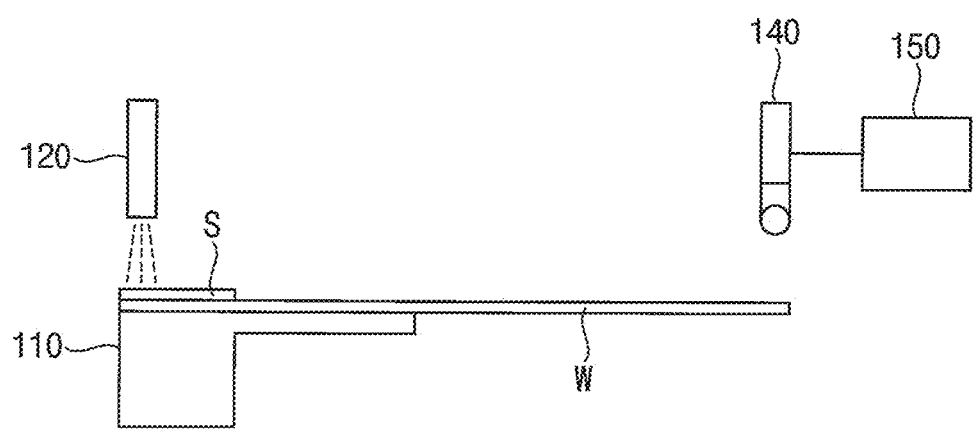

Referring to FIG. 2, the solvent nozzle 120 may be arranged over the central portion of the wafer W placed on the spin chuck 110. The solvent nozzle 120 may dispense the solvent S to the central portion of the upper surface of the wafer W in the vertical direction.

Referring to FIG. 3, the spin chuck 110 may rotate the wafer W. Thus, the solvent S on the central portion of the upper surface of the wafer W may spread to the edge portion of the upper surface of the wafer W by the centrifugal force.

Figure 4:
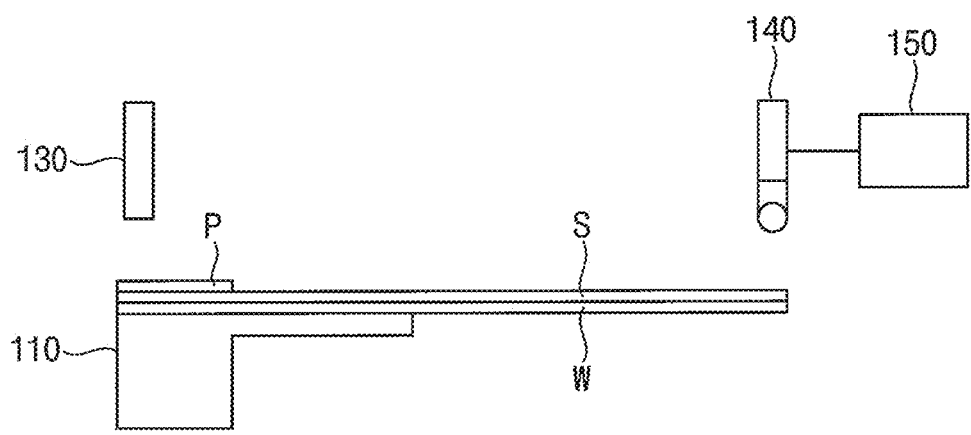

Referring to FIG. 4, the photoresist nozzle 130 may be arranged over the central portion of the upper surface of the wafer W. The photoresist nozzle 130 may dispense the photoresist P to the central portion of the upper surface of the wafer W in the vertical direction.

Figure 5:
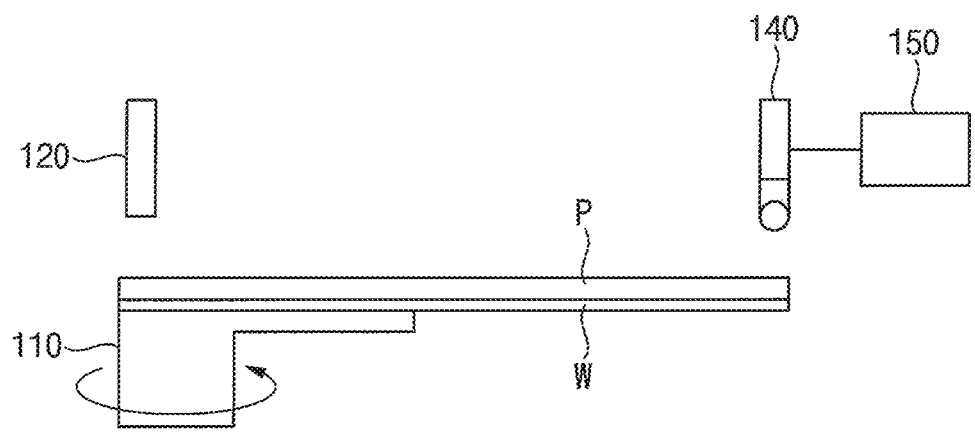

Referring to FIG. 5, the spin chuck 110 may rotate the wafer W. Thus, the photoresist P on the central portion of the upper surface of the wafer W may spread to the edge portion of the upper surface of the wafer W by the centrifugal force to planarize the photoresist P. Here, the photoresist P may be cohered with each other, such as aggregate and/or accumulate, on the edge portion of the upper surface of the wafer W to form the edge bead.

Figure 6:
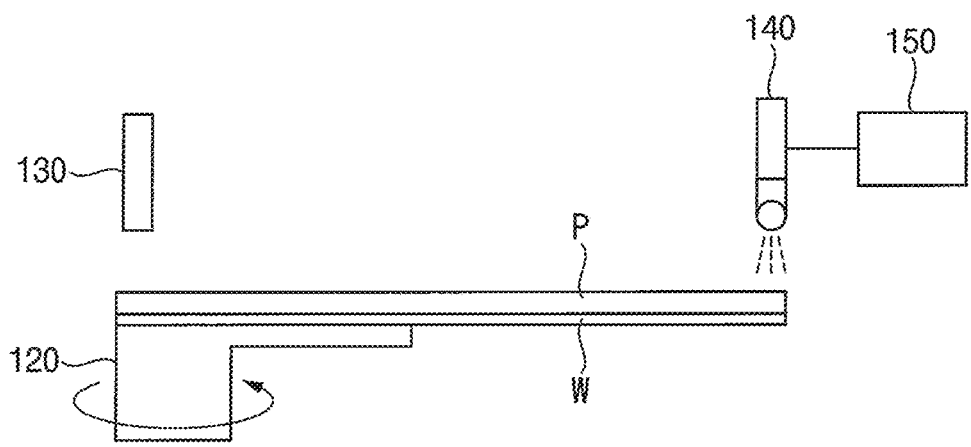

Referring to FIG. 6, the hovering solution nozzle 140 may inject the hovering solution to the edge portion of the upper surface of the wafer W, e.g., the edge portion of the photoresist P to limit and/or prevent the edge bead of the photoresist P on the edge portion of the upper surface of the wafer W from being generated. Particularly, during the spin chuck 110 may rotate the wafer W, the hovering solution nozzle 140 may inject the hovering solution to the edge portion of the photoresist P. That is, the injection of the hovering solution may be performed simultaneously with the planarization process of the photoresist P.

Referring to FIG. 9, the air layer A may exist between the hovering solution D and the wafer W. When an x axis may indicate a progressing direction of the hovering solution D and the air layer A and a z axis may indicate the vertical direction, a force balance along the z axis may be made by a weight Fg of the hovering solution D and a force $F_L$ of the air layer A. The weight Fg of the hovering solution D may correspond to the downward repulsive force. The force $F_L$ of the air layer A may correspond to the upward repulsive force. Thus, when the force $F_L$ of the air layer A may be stronger than the weight Fg of the hovering solution D, the hovering phenomenon of the hovering solution D may be generated.

When the hovering solution D may have a hovering length L and the air layer A may have a thickness h, the thickness h of the air layer A may be greatly less than the hovering length L so that a lubrication theory may be applied to the air layer A to obtain following Formula.

$$\frac{dp}{dx} = 6\mu_a \left( \frac{U + v_a}{h^2} - \frac{2Q}{h^3} \right)$$

In Formula, p(x) may be a lubrication pressure, $\mu_a$ may be a viscosity of the air layer A, U may be a speed of the hovering solution D, $v_a$ may be a speed of the air layer A, and Q may be a flux of the hovering solution D.

Formula may be represented by graphs in FIGS. 10 to 12. FIG. 10 may show the thickness of the air layer A. FIG. 11 may show dp/dx in accordance with a lengthwise direction. FIG. 12 may show a pressure of the air layer A in accordance with the lengthwise direction. Thus, the edge portion of the photoresist P on the edge portion of the wafer W may receive the pressure in FIG. 12.

In contrast, when the speed of the hovering solution D may be increased, the hovering solution D may not be hovered over the edge portion of the photoresist P. The hovering solution D may be bounced from the edge portion of the photoresist P. Thus, it may be required to provide the hovering solution D with a minimum speed at which the hovering solution D may not be bounced.

The hovering condition may be obtained from following Formula having the speed U of the hovering solution and the speed $v_a$ of the air layer A as variables.

$$6\mu_a(U+v_a)\cdot C - \rho_l g \pi R^2 > 0, C \approx 4.25$$

In Formula, $$\rho_l \left( 997 \frac{\text{kg}}{\text{m}^3} \right)$$

may be a density of the hovering solution D and R may be a radius of the hovering solution D. In Formula, a left component may correspond to the upward repulsive force and a right component may correspond to the downward repulsive force. That is, when the upward repulsive may be stronger than the downward repulsive force, the hovering of the hovering solution D may be generated.

In FIG. 13, a horizontal axis may represent the speed U of the hovering solution and a vertical axis may represent the speed $v_a$ of the air layer A. A point a may represent a case that the hovering solution D may be stuck to the wafer W due to a slow speed of the wafer W. A point b may represent a case that a part of the hovering solution may make contact with the wafer and the other part of the hovering solution may be floated from the wafer W. A point c may represent a case that the hovering solution D may be bounced from the wafer W. A point d may represent a case that the hovering solution D may be hovered with the wafer W. Therefore, the hovering phenomenon may be generated in a region K connected between the point b and the point c with including the point d.

As shown in FIG. 14, when the hovering solution D may be hovered from the edge portion of the photoresist P, a marangoni effect may be generated between the hovering solution D and the photoresist P having different the surface tensions. Thus, the hovering solution having the relatively low surface tension may diffuse into the photoresist P having the relatively high surface tension to reduce the surface tension of the photoresist P. As a result, the formation of the bead on the edge portion of the photoresist P may be more suppressed. Particularly, when the hovering solution D may have volatility higher than volatility of the photoresist P, a marangoni flow may be strongly formed in the photoresist P to more reduce the surface tension of the photoresist P.

Therefore, the edge bead of the photoresist P may not be formed on the edge portion of the wafer W by the hovering phenomenon and the marangoni effect. Particularly, the operation of the hovering solution D may be performed during the planarization process of the photoresist P. Thus, the photoresist P having a uniform thickness may be coated on the central portion and the edge portion of the upper surface of the wafer W.

Figure 7:
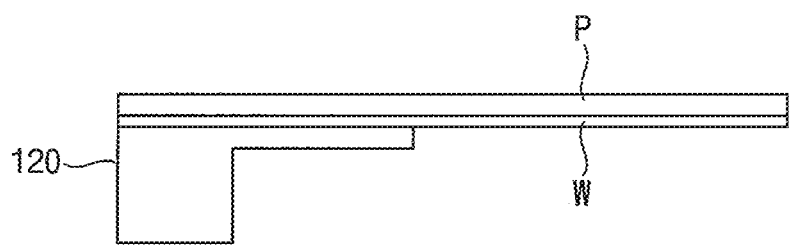

Referring to FIG. 7, the infrared ray may be applied to the photoresist P having the uniform thickness to reflow the photoresist P. The reflow process may be performed with the wafer being rotated by the spin chuck 110.

Figure 8:
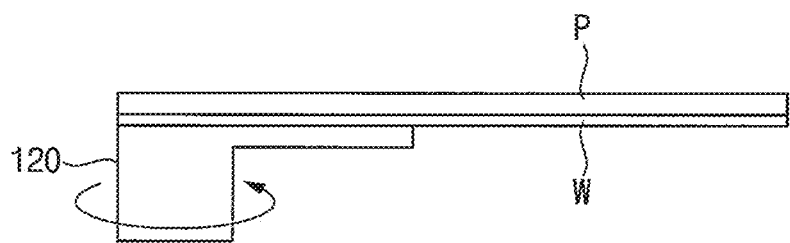

Referring to FIG. 8, the thickness of the photoresist P on the wafer W may be finally controlled with the wafer W being rotated.

According to example embodiments, during planarizing the photoresist on the upper surface of the wafer, the hovering solution may be injected to the edge portion of the photoresist under the condition that the hovering solution may be hovered with respect to the edge portion of the photoresist on the edge portion of the wafer to apply a pressure to the edge portion of the photoresist without a direct contact between the hovering solution and the edge portion of the photoresist. Thus, a bead of the photoresist may not be formed on the edge portion of the wafer. As a result, the photoresist having a uniform thickness may be coated on the upper surface of the wafer to improve a yield of a semiconductor device by increasing an effective area of the edge portion of the wafer.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of embodiments of inventive concepts. Accordingly, all such modifications are intended to be included within the scope of embodiments of inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of coating a photoresist, the method comprising:
   providing the photoresist on an upper surface of a wafer, the wafer being rotated; and
   injecting a hovering solution toward an edge portion of the photoresist under a hovering condition such that the hovering solution hovers with respect to the edge portion of the photoresist on an edge portion of the upper surface of the wafer with an air layer between the hovering solution and the photoresist to prevent a bead of the photoresist from forming on the edge portion of the upper surface of the wafer.

2. The method of claim 1, wherein the injecting the hovering solution comprises injecting the hovering solution in a direction substantially perpendicular to the upper surface of the wafer.

3. The method of claim 2, wherein
   the hovering condition generates an upward repulsive force from the air layer to the hovering solution in a vertical direction with respect to the upper surface of the wafer, and
   the upward repulsive force is stronger than a downward repulsive force applied to the air layer from the hovering solution in the vertical direction.

4. The method of claim 3, wherein the downward repulsive force is determined by a flux and a speed of the hovering solution.

5. The method of claim 1, wherein the hovering solution comprises a material having a surface tension lower than a surface tension of the photoresist.

6. The method of claim 5, wherein the hovering solution comprises water.

7. The method of claim 1, wherein the providing the photoresist on the upper surface of the wafer comprises:
   dispensing the photoresist on the upper surface of the wafer; and
   rotating the wafer to planarize the photoresist.

8. The method of claim 7, wherein the injecting the hovering solution to the edge portion of the photoresist is performed simultaneously with the rotating the wafer.

9. The method of claim 7, wherein the providing the photoresist on the upper surface of the wafer is performed after dispensing a solvent on the upper surface of the wafer.

10. The method of claim 1, further comprising:
    reflowing the photoresist on the upper surface of the wafer after the injecting the hovering solution.

11. The method of claim 10, further comprising:
    rotating the wafer to control a thickness of the photoresist on the upper surface of the wafer after the reflowing the photoresist.

12. A method of coating a photoresist, the method comprising:
    dispensing a solvent on an upper surface of a wafer;
    dispensing the photoresist on the upper surface of the wafer;
    rotating the wafer to planarize the photoresist while simultaneously injecting a hovering solution toward an edge portion of the photoresist, the hovering solution being injected in a direction substantially perpendicular to the upper surface of the wafer under a hovering condition such that the hovering solution hovers with respect to the edge portion of the photoresist on an edge portion of the upper surface of the wafer with an air layer between the hovering solution and the photoresist to prevent a bead of the photoresist from forming on the edge portion of the upper surface of the wafer; and
    reflowing the photoresist.

13. The method of claim 12, wherein
    the hovering condition generates an upward repulsive force from the air layer to the hovering solution in a vertical direction with respect to the upper surface of the wafer, and
    the upward repulsive force is stronger than a downward repulsive force applied to the air layer from the hovering solution in the vertical direction.

14. The method of claim 12, wherein the hovering solution comprises a material having a surface tension lower than a surface tension of the photoresist.

* * * * *